(12) United States Patent
Hsu et al.

(10) Patent No.: US 8,399,321 B2
(45) Date of Patent: Mar. 19, 2013

(54) METHOD FOR MANUFACTURING MEMORY DEVICE

(75) Inventors: Ping Hsu, Taoyuan County (TW); Yi-Nan Chen, Taoyuan County (TW); Hsien-Wen Liu, Taoyuan County (TW)

(73) Assignee: Nanya Technology Corporation, Taoyuan (TW)

( * ) Notice: Subject to any disclaimer, the term of this patent is extended or adjusted under 35 U.S.C. 154(b) by 165 days.

(21) Appl. No.: 13/111,745

(22) Filed: May 19, 2011

(65) Prior Publication Data

US 2012/0295408 A1 Nov. 22, 2012

(51) Int. Cl.
*H01L 21/8242* (2006.01)
*H01L 21/336* (2006.01)
*H01L 21/425* (2006.01)

(52) U.S. Cl. ......... 438/243; 438/289; 438/308; 438/525

(58) Field of Classification Search ......................... None
See application file for complete search history.

(56) References Cited

U.S. PATENT DOCUMENTS

| 6,696,717 | B2* | 2/2004 | Chang et al. | 257/301 |
| 7,732,274 | B2* | 6/2010 | Zhu et al. | 438/243 |
| 7,951,655 | B2* | 5/2011 | Kim | 438/151 |
| 2010/0283093 | A1* | 11/2010 | Pei et al. | 257/303 |

* cited by examiner

*Primary Examiner* — Scott B Geyer

(57) ABSTRACT

The method for manufacturing a memory device is provided. The method includes: implanting a first impurity into the substrate adjacent to the gate conductor structure to form a source region on a first side of the gate conductor structure and a drain region on a second side of the gate conductor structure; implanting a second impurity into the substrate to form a halo implantation region disposed adjacent to the source region, wherein the halo implantation region has a doping concentration which does not degrade a data retention time of the memory device; and performing an annealing process to the drain region, forming a diffusion region under the drain region, wherein the process temperature of the annealing process is controlled to ensure that the diffusion region has a doping concentration substantially equal to a threshold concentration which maintains an electrical connection between the drain and the deep trench capacitor.

15 Claims, 5 Drawing Sheets

METHOD FOR MANUFACTURING MEMORY DEVICE

BACKGROUND

1. Technical Field

The present invention relates to a method for manufacturing a memory device, and more particularly, to a method for manufacturing a memory device with reduced sub-threshold voltage issues.

2. Description of the Related Art

Small sizes, faster speed performances and larger memory capacities are important characteristics for dynamic random access memories (DRAMs). Typically, standard DRAM cells include a transistor and a capacitor. Since the capacity of standard DRAMs has reached 256 MB and up to 512 MB, the size of memory cells and transistors has shrunk to meet demands for high integration, higher memory capacity and higher operating speeds.

A DRAM is an important semiconductor device in the information and electronics industry. Most DRAMs have one access transistor and one storage capacitor in one DRAM cell. With increased integration, however, 3-D capacitors, such as deep trench capacitors, have become necessary. Generally the storage capacitor is formed within a deep trench etched into a semiconductor substrate. The storage capacitor is accessed using an access transistor which allows charges to be stored in the storage capacitor or retrieves charges from the storage capacitor depending on whether the desired action is a read or write function.

FIG. 1 is a conventional dynamic random access memory (DRAM) cell 50 layout. An access transistor 14 includes a gate conductor (i.e. wordline) 12, source region 16, a drain region 18, and a nitride cap (NIT) 30 which are bordered by insulation spacers 32. Deep trench capacitors 10 are disposed under and passing the gate conductor 12 and embedded into a substrate 60. The source region 16 is electrically coupled to a bit line contact 20 which connects to bit lines (not shown) for reading and writing to the storage node 15 through the access transistors 14, and the drain region 18 is electrically coupled to a buried strap outdiffusion 22 of a storage node 15 of the trench capacitors 10 through diffusion regions 27 formed by subjecting the drain region 18 to a rapid thermal process (RTP). Access transistors 14 are activated by the gate conductor 12. The entire structure is covered with an insulator 28 such as boron phosphorous silicate glass (BPSG) which includes an underlying insulator layer 34. The storage node 15 is isolated by a dielectric collar 26. A shallow trench isolation (STI) 24 is provided over the storage nodes 15 to electrically isolate the gate conductor 12 formed above the storage nodes 15.

When voltage is applied to the gate conductor 12, a channel below the gate conductor 12 is conducted and allows current to flow between a source region 16 and a drain region 18 and into or out of the storage node 15. The gate conductor 12 is preferably spaced across the smallest possible distance to conserve layout area. As integration of semiconductor devices increases, the transistors therein, are being gradually scaled down. As a result, the channel length L of the transistors is being reduced, and thus the distance between the source region 16 and the diffusion regions 27 is also being reduced, which may cause a short channel effect involving punch-through, and degradation of sub-threshold voltage (sub-vt).

Further, in the convention process for fabricating DRAMs, the rapid thermal process for forming diffusion regions 27 thereof, has a process temperature as high as possible, in order to ensure that the drain region 18 can be electrically coupled to the buried strap outdiffusion 22 through the diffusion regions 27. Accordingly, the high process temperature of the rapid thermal process increases the impurity concentration of the diffusion regions 27, thereby increasing the risk of short channel effect.

In order to avoid short channel effect, a tilted ion implant (such as a halo implant) is performed to the substrate 60 to surround the source region 16, which prevents the occurrence of the short channel effect, or leakage current, and reduces problems occurring from the sub-threshold voltage (sub-vt) issue. For a halo implant, the implantation dose is increased in order to suppress the short channel effect. A high halo implantation dose, however, degrades the electrical contact between the source region 16 and the bit line contact and reduces the data retention time of DRAMs.

Therefore, a novel method for fabrication of a DRAM which overcomes the above problems is desired.

SUMMARY

The disclosure provides a method for manufacturing a memory device, wherein the method includes: providing a substrate including a deep trench capacitor and a gate conductor structure; implanting a first impurity into the substrate adjacent to the gate conductor structure to form a source region on a first side of the gate conductor structure and a drain region on a second side of the gate conductor structure; implanting a second impurity into the substrate to form a halo implantation region disposed simultaneously adjacent to and under the source region, wherein the halo implantation region has a doping concentration which does not degrade a data retention time of the memory device; and performing an annealing process to the drain region, forming a diffusion region under the drain region, wherein the process temperature of the annealing process is controlled to ensure that the diffusion region has a doping concentration substantially equal to a threshold concentration which maintains an electrical connection between the drain and the deep trench capacitor.

The method of the disclosure for manufacturing a memory device can be used to suppress short channel effect (avoiding punch-through, and reducing sub-threshold voltage (sub-vt) issue) and maintain the electrical connection between the gate conductor and the deep trench capacitor without degrading the data retention time of the memory device.

A detailed description is given in the following embodiments with reference to the accompanying drawings.

BRIEF DESCRIPTION OF THE DRAWINGS

The disclosure can be more fully understood by reading the subsequent detailed description and examples with references made to the accompanying drawings, wherein.

DETAILED DESCRIPTION

The following description is of the best-contemplated mode of carrying out the disclosure. This description is made for the purpose of illustrating the general principles of the disclosure and should not be taken in a limiting sense. The scope of the disclosure is best determined by reference to the appended claims.

In an embodiment of the disclosure, in order to suppress short channel effect and improve data retention time of the memory device, the method for manufacturing a memory device includes: providing a substrate including a deep trench capacitor and a gate conductor structure; implanting a first impurity into the substrate adjacent to the gate conductor structure to form a source region on a first side of the gate conductor structure and a drain region on a second side of the gate conductor structure; implanting a second impurity into the substrate to form a halo implantation region disposed simultaneously adjacent to and under the source region, wherein the halo implantation region has a doping concentration which does not degrade a data retention time of the memory device; and performing an annealing process to the drain region, forming a diffusion region under the drain region, wherein the process temperature of the annealing process is controlled to ensure that the diffusion region has a doping concentration substantially equal to a threshold concentration which maintains an electrical connection between the drain and the deep trench capacitor.

Figure 1:
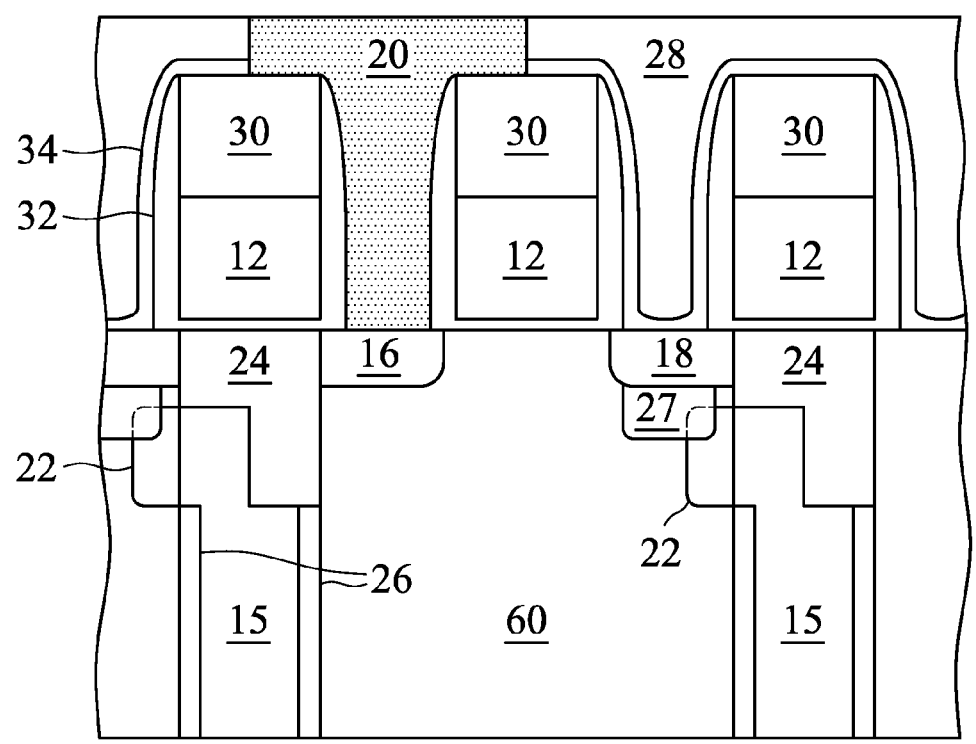
FIG. 1 is a cross-sectional diagram of a conventional dynamic random access memory (DRAM) cell.
Figure 2:
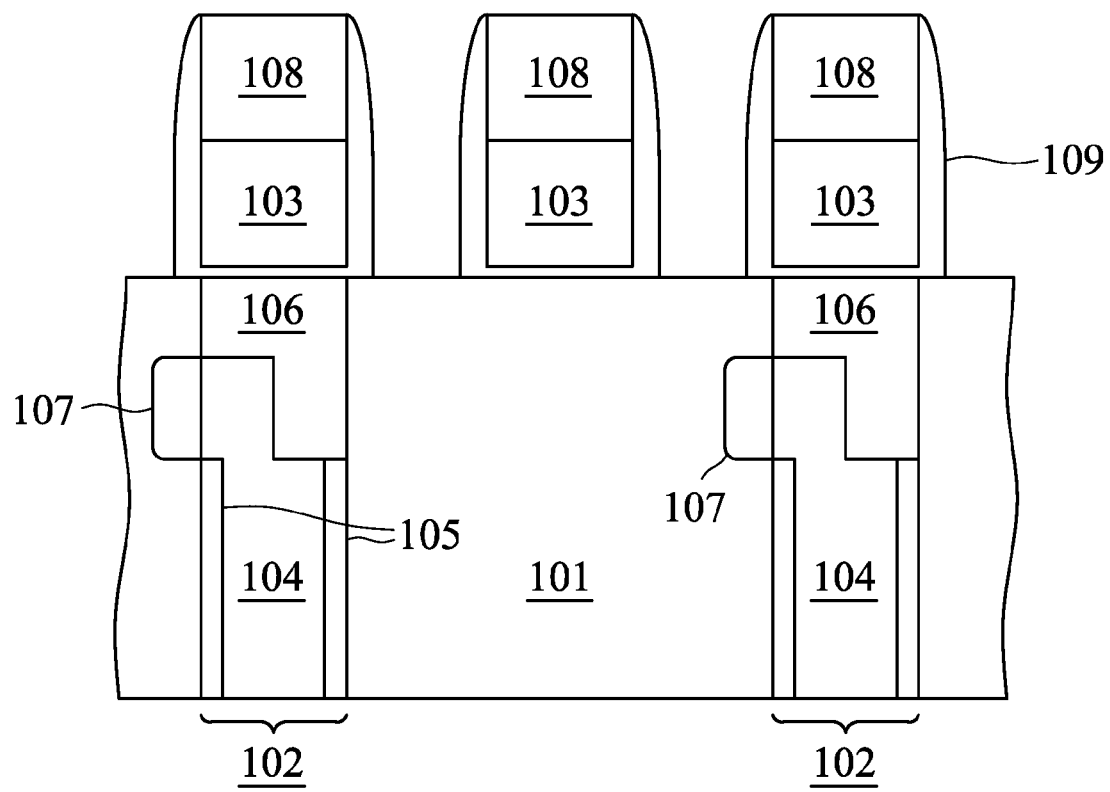
FIGS. 2-5 are cross-sectional diagrams showing the method for manufacturing a memory device according to an embodiment of the disclosure.
Figure 3:
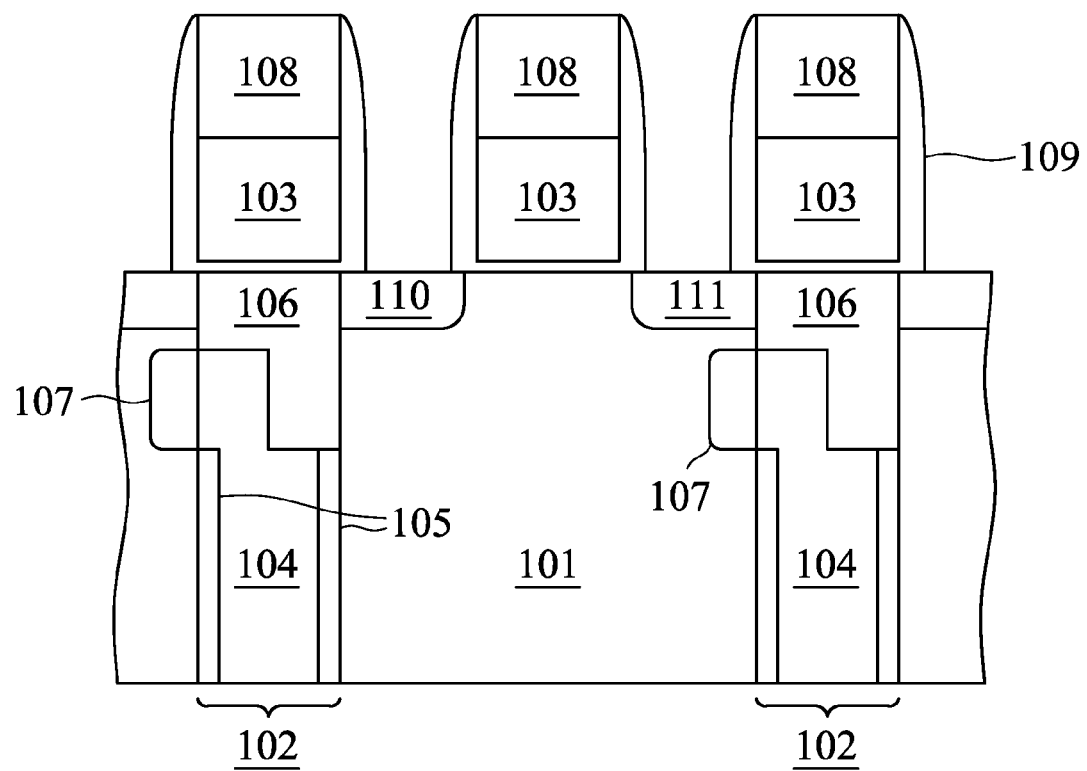
Figure 4:
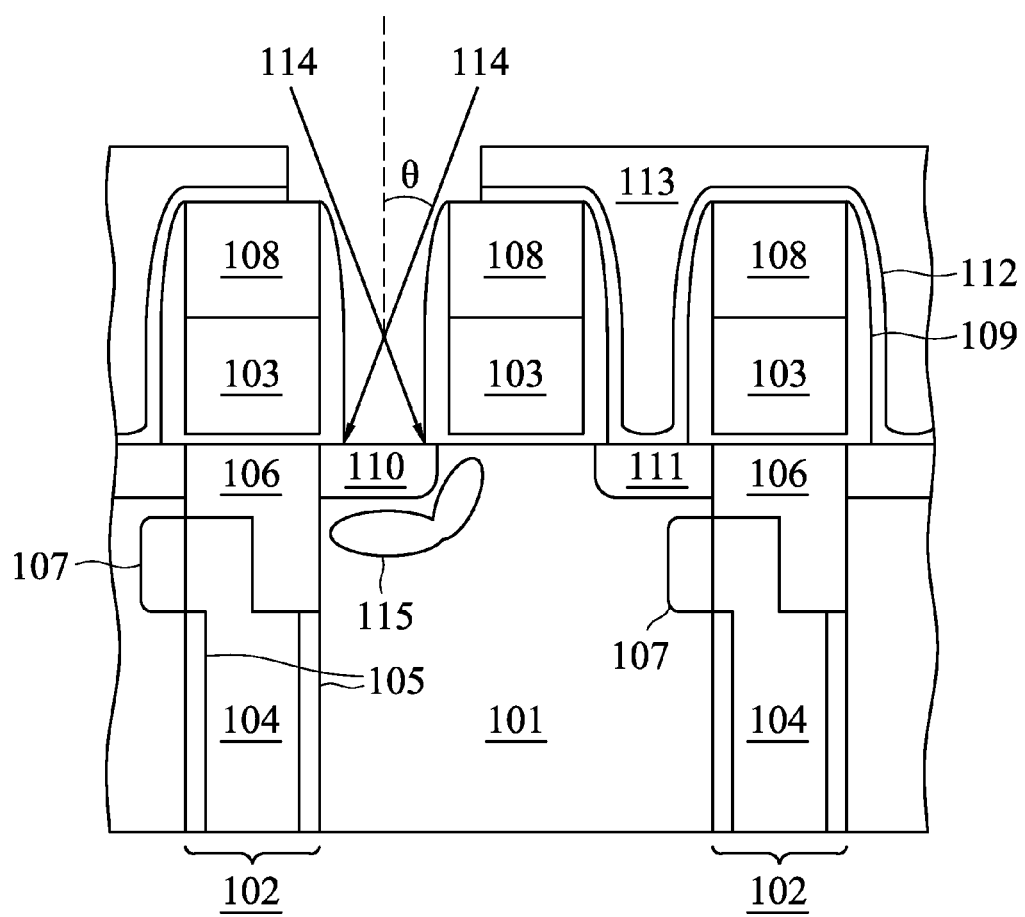

FIGS. 2-4 are cross sections of a method for manufacturing a memory device according to an embodiment of the disclosure.

First, as shown in FIG. 2, a substrate 101 is provided, wherein a plurality of deep trench capacitors 102 are embedded into the substrate 101. A plurality of gate conductors 103 are disposed on the surface of the substrate 101, wherein the gate conductors 103 are disposed directly over the deep trench capacitors 102 and the surface of the substrate 101 between the two adjacent deep trench capacitors 102. The deep trench capacitor 102 includes a storage node 104 surrounded by a collar dielectric layer 105, a shallow trench isolation (STI) 106 over the storage nodes 104 to electrically isolate the gate conductor 103 formed above the storage nodes 104, and a buried strap outdiffusion 107 adjacent to the storage nodes 104. A nitride cap (NIT) 108 is disposed on the gate conductors 103 and an insulation spacer 109 is formed on the side walls of the gate conductors 103 and the nitride cap (NIT) 108.

Next, as shown in FIG. 3, a first implantation process is performed to implant a first type impurity into the substrate 101 with the gate conductor structure 103 serving as a mask, forming a source region 110 on a first side of the gate conductor 103 and a drain region 111 on a second side of the gate conductor 103. In this embodiment, the minimum distance between the source region 110 and the drain region 111 can be less than 80 nm (such as 70 nm). The first type impurity can be n-type ions, such as phosphors, or arsenic. After the first implantation process, an underlying insulator layer 112 is conformally formed on the substrate 101, the nitride cap (NIT) 108, and the insulation spacers 109.

Next, as shown in FIG. 4, a first photoresist 113 is blanketly formed on the substrate 101. Next, the first photoresist 113 and the underlying insulator layer 112 are further patterned to expose the top surface of the source region 110. Next, a second implantation process (an angled halo implantation 114) is used to allow the second type impurity to travel as far under the gate conductor 103 as possible to increase the area of the halo implantation region 115 around the source region 110. The halo implantation region 115 can be disposed adjacent to the source region 110 and/or further disposed under the source region 110. The angled halo implantation 114 includes implanting the second type impurity into the substrate 101 at a specific implantation angle θ with the substrate 101, wherein the specific implantation angle θ can be in a range of 10-15 degree angles (for example 13 degree angle). The specific implantation angle θ prevents the implanted species from sufficiently diffusing ahead of the source region 110. In order to suppress short channel effect, the implantation energy and the implantation dose of the angled halo implantation 114 should be controlled to be above 30 KeV and 2.5E13, respectively. Meanwhile, in order to prevent the halo implantation region 115 from degrading with the data retention time of the memory device, the implantation energy and the implantation dose of the angled halo implantation 114 should be controlled to be below 40 KeV and 3.0E13, respectively. In this embodiment, the angled halo implantation 114 has an implantation energy of 35 KeV and an n implantation dose of 2.9E13. The second type impurity can be p-type ions, such as boron.

Figure 5:
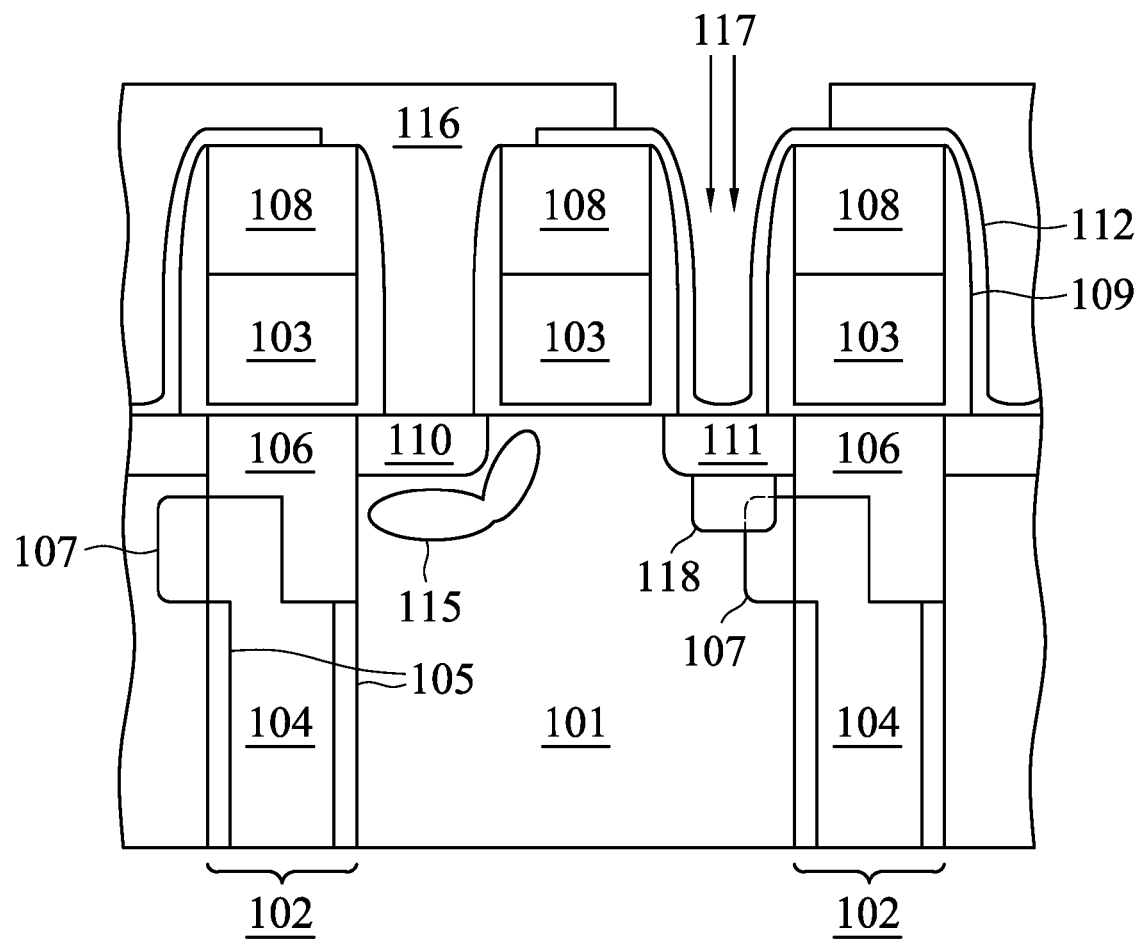

Next, as shown in FIG. 5, after removing the first photoresist 113, a second patterned photoresist 116 is formed on the substrate 101 to expose the top surface of drain region 111. Next, an annealing process 117 (such as rapid thermal process) is performed to the drain region 111, forming a diffusion region 118 under the drain region 111. As show in FIG. 5, after the annealing process 117, the drain region 111 can be electrically connected with the buried strap outdiffusion 107 (directly contacting to the storage nodes 104) via the diffusion region 118.

It should be noted that since the implantation energy and implantation dose of the angled halo implantation 114 are controlled to be below specific values in order to prevent the halo implantation region 115 from degrading the data retention time of the memory device, the diffusion region 118 should have a lower doping concentration (in comparison with convention fabrication of DRAM) to ensure that the short channel effect is suppressed. Further, in order to maintain the electrical connection between the drain 111 and the deep trench capacitor 102, the process temperature of the annealing process 117 is lowered (in comparison with convention fabrication of DRAM) to ensure that the diffusion region 118 has a doping concentration substantially equal to a threshold concentration which maintains an electrical connection between the drain and the deep trench capacitor.

Accordingly, short channel effect can be avoided, the data retention time of the memory device can be improved, and the electrical connection between the gate conductor and the deep trench capacitor can be maintained, since the implantation energy and the implantation dose of the angled halo implantation are controlled to be between a specific range, and the annealing process has a lower process temperature for reducing the doping concentration of the diffusion region 118 (the diffusion region can have a doping concentration substantially equal to a threshold concentration).

While the disclosure has been described by way of example and in terms of the preferred embodiments, it is to be understood that the disclosure is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for manufacturing a memory device, comprising:
   providing a substrate including a deep trench capacitor and a gate conductor structure;
   implanting a first impurity into the substrate adjacent to the gate conductor structure to form a source region on a first side of the gate conductor structure and a drain region on a second side of the gate conductor structure;

implanting a second impurity into the substrate to form a halo implantation region disposed adjacent to the source region, wherein the halo implantation region has a doping concentration which does not degrade a data retention time of the memory device; and performing an annealing process to the drain region, forming a diffusion region under the drain region, wherein the process temperature of the annealing process is controlled to ensure that the diffusion region has a doping concentration substantially equal to a threshold concentration which maintains an electrical connection between the drain and the deep trench capacitor.

2. The method as claimed in claim 1, wherein the process of implanting a second impurity to form the halo implantation region comprises implanting the second impurity at substantially 10-15 degree angles.

3. The method as claimed in claim 1, wherein the process of implanting a second impurity to form the halo implantation region comprises implanting the second impurity with an implantation energy in a range of 30-40 KeV.

4. The method as claimed in claim 1, wherein the process of implanting a second impurity to form the halo implantation region comprises implanting the second impurity with an implantation dose in a range of 2.5E13 to 3.0E13.

5. The method as claimed in claim 1, wherein the process of implanting a second impurity to form the halo implantation region comprises implanting the second impurity at a substantially 13 degree angle with the substrate.

6. The method as claimed in claim 1, wherein the process of implanting a second impurity to form the halo implantation region comprises implanting the second impurity with an implantation energy of 35 KeV.

7. The method as claimed in claim 1, wherein the process of implanting a second impurity to form the halo implantation region comprises implanting the second impurity with an implantation dose of 2.9E13.

8. The method as claimed in claim 1, wherein the first impurity comprises n-type ions.

9. The method as claimed in claim 1, wherein the second impurity comprises p-type ions.

10. The method as claimed in claim 1, wherein the first impurity comprises arsenic ions.

11. The method as claimed in claim 1, wherein the second impurity comprises boron ions.

12. The method as claimed in claim 1, wherein the diffusion region is electrically connected to the deep trench capacitor via a buried strap outdiffusion.

13. The method as claimed in claim 1, wherein the annealing process comprises a rapid thermal annealing process.

14. The method as claimed in claim 1, wherein the doping concentration of the diffusion region is less than the doping concentration of the source region after the annealing process.

15. The method as claimed in claim 1, wherein the halo implantation region is disposed simultaneously adjacent to and under the source region.

\* \* \* \* \*